(12) United States Patent
Sone

(10) Patent No.: US 6,451,184 B1
(45) Date of Patent: *Sep. 17, 2002

(54) THIN FILM FORMING APPARATUS AND PROCESS FOR FORMING THIN FILM USING SAME

(75) Inventor: Kazuho Sone, Chiba (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/025,414

(22) Filed: Feb. 18, 1998

(30) Foreign Application Priority Data

Feb. 19, 1997 (JP) .............................. 9-035125
Apr. 14, 1997 (JP) .............................. 9-095831

(51) Int. Cl.⁷ ..................... C23C 14/00; C25B 11/00; C25B 13/00
(52) U.S. Cl. ..................... 204/298.11; 204/298.06; 204/298.07
(58) Field of Search .................. 204/192.12, 298.06, 204/298.07, 298.11, 298.15, 192.26, 298.13, 298.23, 298.28, 192.23

(56) References Cited

U.S. PATENT DOCUMENTS

| | | | | |
|---|---|---|---|---|
| 4,572,842 A | * | 2/1986 | Dietrich et al. ............ | 427/571 |
| 4,654,112 A | * | 3/1987 | Douglas et al. ............ | 156/643 |
| 4,664,935 A | * | 5/1987 | Strahl ......................... | 427/38 |
| 4,824,544 A | * | 4/1989 | Mikalesen .................. | 204/298 |
| 4,931,158 A | * | 6/1990 | Bunshah et al. .......... | 204/192.29 |
| 5,223,108 A | * | 6/1993 | Hurwitt ...................... | 204/192.12 |
| 5,380,414 A | * | 1/1995 | Tepman .................... | 204/192.3 |
| 5,382,339 A | * | 1/1995 | Aranovich ................ | 204/192.12 |
| 5,415,753 A | * | 5/1995 | Hurwitt et al. ........... | 204/192.12 |
| 5,635,036 A | * | 6/1997 | Demaray et al. ......... | 204/192.12 |
| 5,660,693 A | * | 8/1997 | Abramson et al. ....... | 204/192.12 |
| 5,705,042 A | * | 1/1998 | Leiphart et al. .......... | 204/192.12 |
| 5,728,276 A | * | 3/1998 | Katsuki et al. ........... | 204/298.11 |

FOREIGN PATENT DOCUMENTS

| | | |
|---|---|---|
| EP | 0106623 A2 | 4/1984 |
| EP | 0401035 A2 | 12/1990 |
| JP | 58110673 A | 7/1983 |
| JP | 62056570 A | 3/1987 |
| JP | 62-274067 | 11/1987 |
| JP | 5-136058 | 6/1993 |
| JP | 6041733 A | 2/1994 |
| JP | 7335553 A | 12/1995 |
| JP | 9041132 A | 2/1997 |
| JP | 9041134 A | 2/1997 |

* cited by examiner

*Primary Examiner*—Stephen Kalafut
*Assistant Examiner*—Julian A. Mercado
(74) *Attorney, Agent, or Firm*—Fitzpatrick, Cella, Harper & Scinto

(57) ABSTRACT

A thin film forming apparatus comprises a substrate holding means for holding a substrate, a target holding means for holding a target, a sputter gas supplying means for supplying into a reaction chamber a sputter gas for sputtering the target, a reactive gas supplying means for supplying a reactive gas, and power supplying means for supplying a power for generating a discharge to take place between the target and the substrate, wherein a partition member having a plurality of openings is provided between the target and the substrate, and a sputter gas is supplied to a space formed between the target and the partition member and a reactive gas is supplied to a space formed between the substrate and the partition member.

8 Claims, 9 Drawing Sheets

THIN FILM FORMING APPARATUS AND PROCESS FOR FORMING THIN FILM USING SAME

BACKGROUND OF THE INVENTION

1. Field of the Invention

This invention relates to a thin film forming apparatus, and more particularly belongs to the technical field of thin film forming processes suited for forming electrodes or protective films for semiconductor elements, electrodes or protective films for liquid-crystal devices, protective films for photomagnetic recording media, reflection preventive films or reflection enhancing films for optical articles, or the like by the use of such an apparatus.

2. Related Background Art

Sputtering is one of thin film forming processes.

Conventional reactive sputtering is a process in which a mixed gas of sputter gas and reactive gas is introduced into a reaction chamber and a compound or metallic target is sputtered to form a metallic compound thin film by the chemical reaction of target constituent atoms with the reactive gas. In the case of insulating compound targets, the process commonly has a low deposition rate because high-frequency power such as RF or microwaves is supplied to cause a glow discharge. In the case of metallic targets, the deposition rate can be improved because a DC voltage can be supplied to cause a glow discharge.

Even when the target is a metal, the reactive gas may react with the metallic target on the target surface, so that unauthorized metallic compounds are formed on the target surface. Usually, the sputtering yield with respect to the metallic compound is about 10% of the sputtering yield with respect to the metal, and hence the deposition rate may be lower in the reactive sputtering.

Even in the case of compound targets, the compound thin films formed actually have a higher metallic atom content than the content determined by the stoichiometric ratio, and hence the reactive gas must be added in order to form films having composition approximate to the stoichiometric ratio. Not to speak of the case of metallic targets, if the reactive gas is supplied at a low flow rate, the metallic compound thin film may be formed as a thin film having metallic atoms in a high content, and cannot possibly be a thin film that satisfies the stoichiometric ratio, resulting in poor thin film characteristics with respect to optical characteristics (such as refractive index and transmittance) and so forth.

Accordingly, some attempts to solve such technical problems are proposed.

FIG. 10 is a schematic view of a reactive sputtering apparatus disclosed in Japanese Patent Application Laid-Open No. 62-56570. Reference numeral 1 denotes a target; 2, a substrate; 3, a supply pipe for argon (Ar) serving as a sputter gas; 4, a supply pipe for oxygen ($O_2$) serving as a reactive gas; 9, a reaction chamber; 12, a target holder; and 7, a substrate holder.

The above publication states that the use of the apparatus shown in FIG. 10 makes the rate of sputtering larger and brings about an improvement in the characteristics of the oxides, since the sputter gas and the reactive gas are separately introduced, and since the sputtering takes place preferentially in the vicinity of the target and the oxidation reaction takes place preferentially in the vicinity of the substrate.

In reality, however, the sputter gas and the reactive gas mix at a zone between the target and the substrate to form a mixed plasma of the both. Especially when a thin film is formed on a large-area substrate, the discharging region between the substrate and the target is so large that the sputter gas and the reactive gas can be separately present with difficulty. Thus, the film quality and the rate of sputtering can not be so much improved as expected.

Meanwhile, FIG. 11 is a schematic view of a reactive sputtering apparatus disclosed in Japanese Patent Application Laid-Open No. 6-41733. Reference numeral 1 denotes a target; 2, a substrate; 3, a supply pipe for argon (Ar) serving as a sputter gas; 4, a supply pipe for oxygen ($O_2$) serving as a reactive gas; 7, a substrate holder; 8, a power source; 9, a reaction chamber; 12, a target holder; 13, a differential pressure plate; 14, a high frequency power source; 15, a coil; 16, a magnet; 17, a pipe for circulating a refrigerant; and 18, an exhaust pump.

In this apparatus, an exhaust vent communicating with a vacuum pump is provided at an upper part of the reaction chamber 9, and the differential pressure plate 13 is utilized to produce a difference in pressure between the reaction chamber upper part and the reaction chamber lower part so that the sputter gas and the reactive gas can be separated.

In the apparatus shown in FIG. 11, however, an opening 13a of the differential pressure plate 13 is larger than the size of the substrate 2, so that, in reality, the sputter gas unwantedly passes through the opening 13a of the differential pressure plate 13 to flow to the substrate 2 side, resulting a large discharge region. Hence, also in such an apparatus, the rate of sputtering and the film quality can not be so much improved as to be expected. Also, since preliminary excitation of oxygen must be made by the high-frequency power source 14, the apparatus must be complicated in constitution and moreover the inner walls of the reactive gas feed pipe 4 is sputtered because of the preliminary excitation to rather cause a greater difficulty that, e.g., substances constituting the reactive gas feed pipe, such as iron, is incorporated into the films to be formed.

In addition, the particles dislocated by sputtering may jump into the substrate to cause an excessive rise of substrate temperature.

Japanese Patent Application Laid-open No. 7-335553 discloses a reactive sputtering apparatus proposed in order to achieve an object different from the above apparatus. This apparatus is provided with a collimator between the target and the substrate in order to fill up contact holes of semiconductor devices.

In the conventional apparatus having a collimator, the collimator has so great an aspect ratio that the target constituent atoms broken away by sputtering are incident on the substrate surface at small angles to make it difficult to form uniform and large-area continuous thin films. Moreover, the surface of the collimator is also sputtered, so that collimator constituent atoms (iron atoms in the case where, e.g., the collimator is made of stainless steel) are included into the TiN thin films to be formed.

The specification and drawings of U.S. Pat. No. 5,415,753 and a publication "THE SECOND INTERNATIONAL SYMPOSIUM ON SPUTTERING & PLASMA PROCESS, 1993, pp.269–274" also disclose a reactive sputtering apparatus provided with a perforated plate between the target and the substrate and also so constructed that the sputter gas and the reactive gas are separately supplied.

In the above reactive sputtering apparatus, however, no sufficient studies are made on the electrical properties of and materials for the perforated plate, and the film quality can not be so much improved as to be expected.

Among materials for thin films, magnesium fluoride ($MgF_2$) attracts notice as a material having a low refractive index (1.38), which, however, often causes absorption of light when films are formed by sputtering. Moreover, when magnesium fluoride films are formed by sputtering, the rate of film formation is said to be lower than that of vacuum deposition.

To cope with this problem, Japanese Patent Applications Laid-open No. 9-41132 and No. 9-41134 disclose a method in which the target is supported through a heat-insulating packing plate so that the target can be kept at a high temperature and a method in which a granular target of $MgF_2$ is used.

Any of these methods, however, have paid attention to improving the rate of sputtering or improving the rate of film formation, without any satisfactory achievement of improvement in film quality. Hence, after all, compound thin films having good optical or electrical characteristics have not been available.

SUMMARY OF THE INVENTION

An object of the present invention is to provide a thin film forming apparatus, and a thin film forming process, that can form a thin film having in-plane uniform thickness and optical and electrical characteristics.

To achieve the above object, the present invention provides a thin film forming apparatus comprising a substrate holding means for holding a substrate, a target holding means for holding a target, a sputter gas supplying means for supplying into a reaction chamber a sputter gas for sputtering the target, a reactive gas supplying means for supplying a reactive gas, and a power supplying means for supplying a power for generating a discharge to take place between the target and the substrate, wherein;

a partition member having a plurality of openings is provided between the target and the substrate;

a sputter gas supply port and a reactive gas supply port are separately provided at a distance from each other so that the sputter gas is supplied to a space formed between the target and the partition member and the reactive gas is supplied to a space formed between the substrate and the partition member; and a potential setting means for setting potential of the partition member is provided.

According to the present invention, because of the presence of the partition member with a preset potential, the plasma of the sputter gas is formed apart from the substrate surface, and hence the thin films formed can be prevented from being adversely affected. Also, on the substrate surface, the reactive gas preferentially combine with the atoms broken away from the target by sputtering, and hence films with a good quality very close to the stoichiometric ratio can be formed.

The partition member also captures a part of the target constituent atoms broken away by sputtering in a large quantity, and hence any excessive rise of substrate temperature can be prevented from being caused by the target constituent atoms jumping into the substrate.

Another object of the present invention is to provide a thin film forming apparatus, and a thin film forming process, that can form uniform and large-area good-quality thin films at a high deposition rate.

To achieve the above object, the present invention provides a thin film forming apparatus comprising a substrate holding means for holding a substrate, a target holding means for holding a target, a sputter gas supplying means for supplying into a reaction chamber a sputter gas for sputtering the target, a reactive gas supplying means for supplying a reactive gas, and a power supplying means for supplying a power for generating a discharge to take place between the target and the substrate, wherein;

a partition member having a plurality of openings is provided between the target and the substrate;

a sputter gas supply port and a reactive gas supply port are separately provided at a distance from each other so that the sputter gas is supplied to a space formed between the target and the partition member and the reactive gas is supplied to a space formed between the substrate and the partition member; and at least the surface of the partition member comprises the same material as that of the target.

According to the present invention, because of the presence of the partition member, the plasma of the sputter gas is formed apart from the substrate surface, and hence the thin films formed can be prevented from being adversely affected. Also, on the substrate surface, the reactive gas preferentially combine with the atoms broken away from the target by sputtering, and hence films with a good quality very close to the stoichiometric ratio can be formed. Even though the partition member is sputtered, any unwanted impurities can be restrained from being included, because the partition member is made of a material that does not affect the thin films to be formed.

The partition member also captures a part of the target constituent atoms broken away by sputtering in a large quantity, and hence any excessive rise of substrate temperature can be prevented from being caused by the target constituent atoms jumping into the substrate.

Still another object of the present invention is to provide a thin film forming apparatus, and a thin film forming process, that can be applied also to the formation of compound thin films of magnesium fluoride or the like, for which it has been considered relatively difficult to achieve good optical characteristics.

To achieve the above object, the present invention provides a thin film forming apparatus comprising a substrate holding means for holding a substrate, a starting material holding means for holding a starting material, a gas supplying means for supplying a sputter gas for sputtering the starting material, and a power supplying means for supplying a power for generating a discharge to take place between the starting material and the substrate, wherein;

a partition member having a plurality of openings is provided between the starting material and the substrate; and the partition member is covered with the same material as the starting material at least on its surface on the side of the starting material, and has a conductor to which a bias voltage is applied.

The present invention also provides a thin film forming process that forms a compound thin film using a thin film forming apparatus comprising a substrate holding means for holding a substrate, a starting material holding means for holding a starting material, a gas supplying means for supplying a sputter gas for sputtering the starting material, and a power supplying means for supplying a power for generating a discharge to take place between the starting material and the substrate;

the process comprising the steps of:

placing the substrate and the starting material in such a way that a partition member having a plurality of openings is interposed between the starting material and the substrate, the starting material comprising the same material as the surface of the partition member;

supplying the sputter gas to a space formed between the target and the partition member; and generating a discharge to take place at least between the starting material and the partition member to form on the substrate a film containing constituent atoms of the starting material.

According to the present invention, because of the presence of the partition member, the plasma of the sputter gas is formed apart from the substrate surface, and hence the thin films formed can be prevented from being adversely affected. Also, even though the partition member is sputtered, any unwanted impurities can be restrained from being included, because the partition member is made of a material that does not affect the thin films to be formed.

The partition member also captures a part of the target constituent atoms broken away by sputtering in a large quantity, and hence any excessive rise of substrate temperature can be prevented from being caused by the target constituent atoms jumping into the substrate. By applying a DC bias to the partition member, ions can be prevented from entering from the target side to the substrate surface.

Thus, compound thin films having in-plane uniform thin film thickness and optical or electrical characteristics can be formed. Also, in the present invention, compound thin films of magnesium fluoride or the like, which has been considered relatively difficult to form, can be formed with ease.

DESCRIPTION OF THE PREFERRED EMBODIMENTS

First Embodiment

Figure 1:
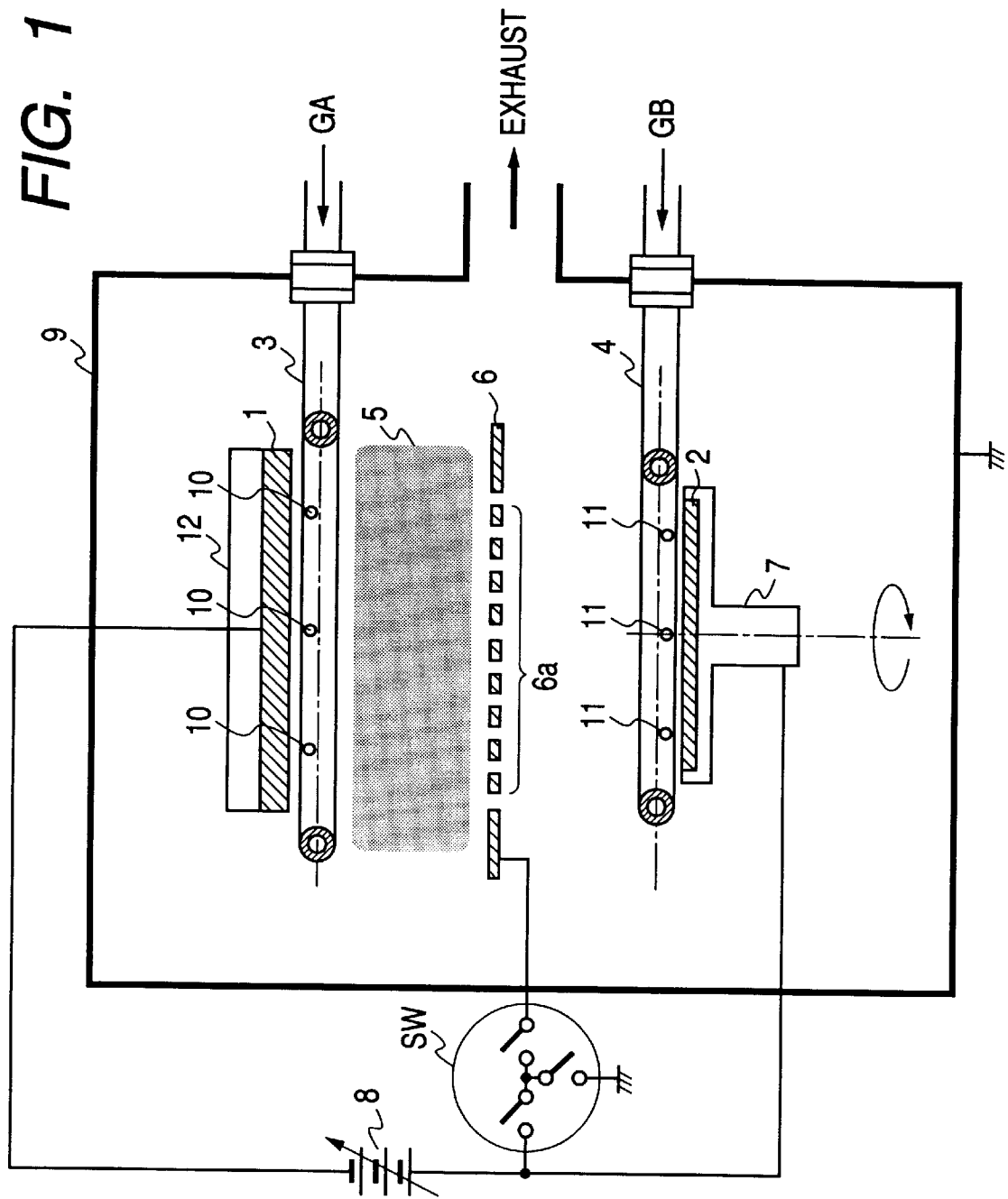
FIG. 1 is a diagrammatic view of a thin film forming apparatus according to a preferred embodiment of the present invention.

FIG. 1 is a schematic sectional view of a thin film forming apparatus using a reactive sputtering according to a preferred embodiment of the present invention.

(Thin Film Forming Apparatus)

The apparatus as shown in FIG. 1 has a substrate holder 7 as a substrate holding means for holding a substrate 2, a target holder 12 as a target holding means for holding a target 1, a gas shower head 3 as a sputter gas supplying means for supplying into a reaction chamber 9 a sputter gas GA for sputtering the target 1, a gas shower head 4 as a reactive gas supplying means for supplying a reactive gas GB, and a power source 8 as a power supplying means for supplying a power for generating a plasma 5 by discharge between the target 1 and the substrate 2.

A grid plate 6 as a partition member having a plurality of openings 6a is also provided between the target 1 and the substrate 2. A supply port 10 for supplying the sputter gas GA and a supply port 11 for supplying the sputter gas GB are separately provided at a distance from each other so that the sputter gas GA is supplied to a space formed between the target 1 and the grid plate 6 and the reactive gas GB is supplied to a space formed between the substrate 2 and the grid plate 6. In addition, during the sputtering, the grid plate 6 is kept at a stated potential by a potential setting means having a switch SW.

Figure 2:
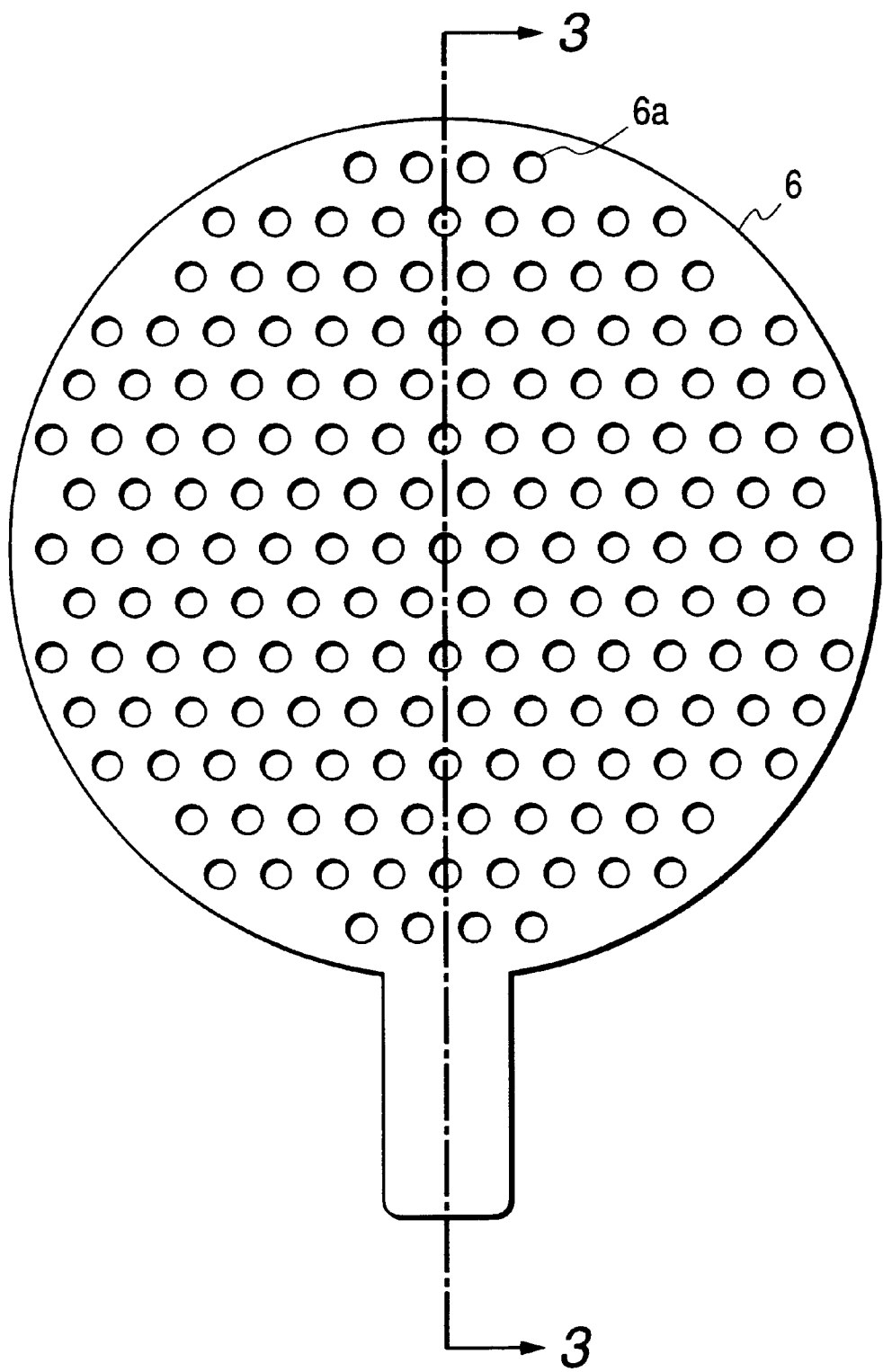
FIG. 2 is a plan view of a partition member used in the thin film forming apparatus of the present invention.
Figure 3:
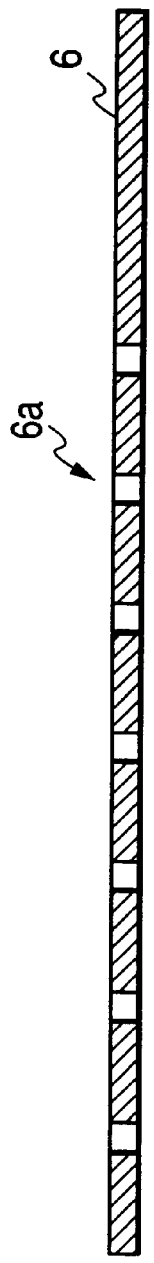
FIG. 3 is a cross section of the partition member used in the thin film forming apparatus of the present invention.

FIG. 2 is a plan view showing an example of the partition member 6 used in the present invention. FIG. 3 is a sectional view of the partition member 6 shown in FIG. 2. At least the surface of the grid plate 6 serving as the partition member may preferably be made of a material selected depending on the constituent material of the target 1 to be sputtered. In other words, the material for the grid plate 6 may preferably be selected depending on the constituent material of the film to be formed. For example, in an instance where a silicon oxide film is formed, a member comprised of silicon (Si) is used; in an instance where a tantalum oxide film is formed, a member comprised of tantalum (Ta) is used; and in an instance where an aluminum oxide film is formed, a member comprised of aluminum (Al) is used. Thus, the grid plate material may be selected from silicon (Si), tantalum (Ta), aluminum (Al), Magnesium (Mg), indium (In), titanium (Ti), copper (Cu), tungsten (W), or the like. The grid plate may be a plate-like member comprising a base member made of a conductive, insulating or semiconductive material as selected regardless of the starting material and having formed on at least a surface of the base member facing the target 1 side a film comprised of the same material as the target.

The plurality of openings 6a provided in the grid plate 6 may preferably have an aspect ratio less than 1.0, and more preferably less than 0.6. This enables depression of mutual diffusion of gas and formation of a film at an appropriate deposition rate and a film can be obtained with a uniform thickness over the whole area.

The openings may have a three-dimensional shape of cylinders, square columns or the like, as viewed from the top of the grid plate. With regard to the planar shape, i.e., opening shape (two-dimensional shape), the openings may have any shape of circles, ellipses, squares, triangles and so on.

The aspect ratio AR of the openings 6a is defined as a value (D/L) given by dividing a depth D of each opening (plate thickness) by a diameter L of a true circle having the same area as the area of the opening. Further, when the substrate surface has a circular shape, the diameter L may preferably be from 1% to 15%, and more preferably from 4% to 10%, of the diameter of the substrate 2.

In order to form a uniform film, the plurality of openings 6a of the grid plate 6 may preferably be distributed in a regular fashion. In order to obtain a uniform large-area thin film at an appropriate deposition rate, their opening percentage may preferably be from 5% to 90%, and more preferably from 20% to 70%.

The grid plate 6 may preferably be electrically floating, or may more preferably be biased at a predetermined potential so as to produce a potential difference between it and the target, in the state of which the sputtering is carried out. Letter symbol SW denotes a switch serving as a potential setting means and also a potential switching means for setting the bias potential of the grid plate 6. The grid plate 6 and the substrate 2 may be set to have either the same potential or different potentials. Also, the grid plate 6 and the reaction chamber may be set to have potentials different from each other. Then the grid plate 6 may preferably be biased to the positive potential with respect to the target. In order to enhance the rate of sputtering, the power supplied may be made higher. If, however, it is done, the sputtered atoms may impinge upon the substrate so much as to cause an excessive rise of the substrate temperature. If so, it is not possible to form a film on those substrates which are subject to thermal deformation. In the present embodiment, since the grid plate partially captures the sputtered atoms, such a problem can be solved. When the grid plate is biased to a negative potential with respect to the target, negative ions bounce back to the target side to prevent the film from being damaged.

The sputter gas supply port 10 may preferably be provided in plurality as shown in FIG. 1, in the vicinity of the target 1, so as to surround the target 1. In the apparatus shown in FIG. 1, the sputter gas supply ports 10 are present on the target 1 side with respect to the pipe center to preferentially blow out the gas to the target 1 side. The sputter gas supply ports 10 are arranged at substantially equal intervals on the gas shower head 3 which is a cyclic supply pipe. In other words, a plurality of supply ports are provided symmetrically on a circumference.

Similarly, the reactive gas supply port 11 may also preferably be provided in plurality in the vicinity of the substrate 2 so as to surround the substrate 2. In the apparatus shown in FIG. 1, the reactive gas supply ports 11 are present on the substrate 2 side with respect to the pipe center to preferentially blow out the gas to the substrate side. The reactive gas supply ports 11 are arranged at substantially equal intervals on the gas shower head 4 which is a cyclic supply pipe. In other words, a plurality of supply ports are provided symmetrically on a circumference.

The substrate holder 7 as the substrate holding means is so constructed as to be rotatable at 1 to 50 rpm during the sputtering. This enables formation of a more uniform film.

A magnet may also be provided at the target holder 12 to carry out the reactive magnetron sputtering. When it is so provided, the sputter gas plasma can be confined more in the vicinity of the target.

As the power source 8, a DC power source is illustrated but an AC power source may be used instead. The AC power source is exemplified by an RF power source of 13.56 MHz, and a DC bias may be optionally superimposed thereon. When the sputtering rate is increased to more improve the thin film deposition rate, it is preferable to carry out DC sputtering using a DC power source.

The exhaust vent of the reaction chamber 9 is connected to an exhaust pump (not shown). The exhaust pump may be constituted of, for example, a combination of a turbo-molecular pump or cryopump for main exhaust and a rotary pump for rough exhaust.

In FIG. 1, what is illustrated is an apparatus in which the target 1 is provided at the upper part and the substrate 2 at the lower part. This upper-lower relation may be reversed so that the substrate is provided at the upper part with its film-forming side down and the target at the lower part with its sputtering side up. Alternatively, the substrate and target may be raised upward on flat plates so that the film-forming surface and the sputtering surface are not horizontal.

(Film Forming Process)

A thin film forming process that forms a thin film using the film forming apparatus as described above will be described below.

First, the target 1, the substrate 2 and the grid plate 6 are arranged in the reaction chamber 9 in the manner as shown in FIG. 1. Here, it is desirable to select the same material for the target 1 and the partition member 6.

First, the partition member 6 having a plurality of openings is disposed. Then, the target 1 is set on the target holder 12. Subsequently the substrate 2 is set on the substrate holder 7.

The inside of the reaction chamber 9 is evacuated, and the substrate 2 is heated or cooled if necessary.

The sputter gas GA is supplied through the supply ports 10 of the gas shower head 3 into the space between the target 1 and the partition member 6, and the reactive gas GB is supplied through the supply ports 11 of the gas shower head 4 into the space between the substrate 2 and the grid plate 6.

The pressure inside of the reaction chamber is maintained approximately at 0.05 to 13 Pa, and more preferably at 0.1 to 1.3 Pa, in the state of which a DC voltage or RF voltage is applied between the target 1 and the substrate 2 to generate a discharge to take place between the target 1 and the partition member 6 biased to form a plasma 5 of the sputter gas. In this state, the formed plasma 5 may extend into the space between the partition member 6 and the substrate 2 through the openings 6a. Constituent atoms of the target as sputtered with the plasma particles pass through the openings 6a of the grid plate 6 and reach the surface of the substrate 2. Here, since the reactive gas capable of reacting with the target constituent atoms is present in the space between the grid plate 6 and the substrate 2, the both react with each other on the substrate surface, so that a film containing the target constituent atoms and the reactive gas constituent atoms can be formed on the substrate.

According to the present embodiment, when the grid plate 6 is constituted of the same material as the target 1, the thin film formed on the substrate 2 is not affected even if the plasma particles have sputtered the grid plate 6. Also, since the grid plate can prevent the reactive gas from flowing out to the target side, the reaction of the reactive gas with the sputtered constituent atoms of the target takes place preferentially on the substrate surface. Thus, the sputtering rate does not lower, and a thin film having composition fairly approximate to the stoichiometric ratio can be formed at a high deposition rate.

The surface materials for the target and for the partition member used in the present invention may include conductive materials such as Si, Al, Ta, In, Sn, Ti, Cu, Zn, Mg and W.

The sputter gas may be selected from He, Ne, Ar, Kr, Xe, or the like.

The reactive gas may be selected from $O_2$, $N_2$, $F_2$, $NF_3$, $O_3$ or the like.

The substrate may be either light-transmitting or non-light-transmitting, and the materials for the substrate may include semiconductor materials such as silicon, GaAs, etc., insulating materials such as glass, quartz, fluorite, etc., and metallic materials such as stainless steel, aluminum, etc.

Thin films that can be formed according to the present invention are compound thin films such as silicon oxide films, aluminum oxide films, tantalum oxide films, indium oxide films, tin oxide films, titanium nitride films, copper oxide films, zinc oxide films, tungsten nitride films, magnesium fluoride films, aluminum fluoride films and so forth.

The thin film forming apparatus of the present invention is effective especially when an optical thin film is formed on a concave or convex surface of a light-transmitting insulating substrate. The optical thin films obtained by the thin film forming process of the present invention exhibit superior characteristics as reflection preventive films or reflection enhancing films for KrF excimer laser and ArF excimer laser optical systems having a high energy.

When films of different compositions are formed using the same thin film forming apparatus, the partition member may be provided detachably from the reaction chamber so that the partition member is exchangeable.

Figure 4:
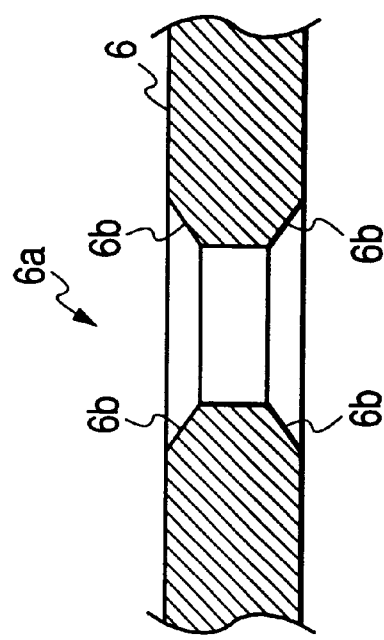
FIG. 4 is a partial cross section of another partition member used in the present invention, at its part in the vicinity of an opening.

There are cases where sputtered atoms may adhere onto a surface of the grid plate, especially where they may adhere to the corners of openings on the target side to stop up the openings. Accordingly, the corners of the openings may preferably be bevelled into a tapered shape so as not to fill up the openings. FIG. 4 is a partial cross section showing such a tapered opening 6a of the grid plate 6. As can be clearly seen when compared with FIG. 3, corners 6b are bevelled. This enables the grid plate to be exchanged at less frequencies and makes the apparatus continuously usable for a longer time.

Second Embodiment

Figure 5:
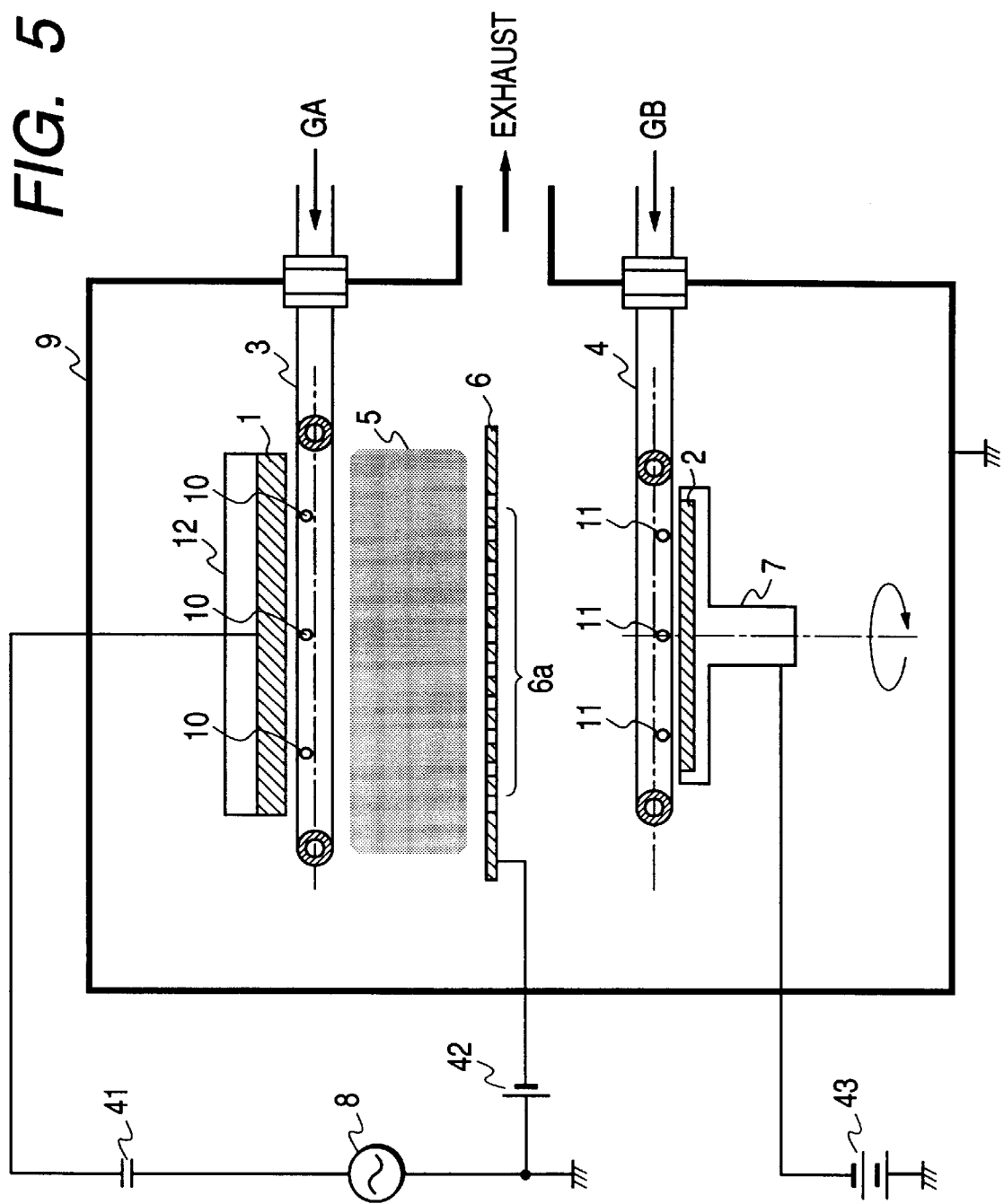
FIG. 5 is a diagrammatic view of a thin film forming apparatus according to another embodiment of the present invention.

FIG. 5 illustrates a thin film forming apparatus according to another embodiment of the present invention.

The thin film forming apparatus shown in FIG. 5 has a substrate holder 7 as a substrate holding means for holding a substrate 2, a target holder 12 as a target holding means for holding a target 1, a gas shower head 3 as a sputter gas supplying means for supplying into a reaction chamber 9 a sputter gas GA for sputtering the target 1, and optionally has a gas shower head 4 as a reactive gas supplying means for supplying a reactive gas GB. It further has a power source 8 as a power supplying means for supplying a power for generating a discharge to take place between the target 1 and the substrate 2 to form a plasma between them. A grid plate 6 as a partition member having a plurality of openings 6a is also provided between the target 1 and the substrate 2. The grid plate is covered with the same material as the target material at least on the side of the target, and has a conductor to which a bias voltage is applied from a bias voltage source 42. Reference numeral 41 denotes a blocking capacitor; and 43, a substrate bias voltage source. A supply port 10 for supplying the sputter gas GA and a supply port 11 for supplying the reactive gas GB may preferably be separately provided at a distance from each other if necessary so that the sputter gas GA is supplied to a space formed between the target 1 and the grid plate 6 and the reactive gas GB is supplied to a space formed between the substrate 2 and the grid plate 6.

Figure 6:
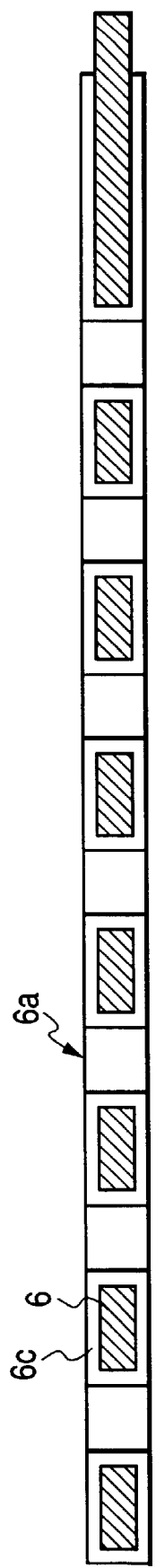
FIG. 6 is a cross section of still another partition member used in the thin film forming apparatus of the present invention.

The partition member (grid plate 6) used in the present embodiment has the same planar shape as the one shown in FIG. 2. FIG. 6 is a cross section of the grid plate 6. At least the surface 6c of the grid plate 6 serving as the partition member is made of a material selected in accordance with constituent materials of the target 1 to be sputtered. In other words, the material for the grid plate 6 should be selected in accordance with constituent materials of the films to be formed. For example, in an instance where magnesium fluoride films are formed, a conductive member covered with magnesium fluoride may be used. In another instance where silicon oxide films are formed, a conductive member covered with silicon oxide may be used; in an instance where tantalum oxide films are formed, a conductive member covered with tantalum oxide may be used; and in an instance where aluminum oxide films are formed, a conductive member covered with aluminum oxide may be used. Thus, the grid plate may be selected from materials such as silicon oxide, tantalum oxide, aluminum oxide, magnesium fluoride, indium oxide, titanium nitride and copper oxide. The grid plate may be a plate-like member comprising i) a base material made of a conductive or semiconductive material selected without regard to the target material and ii) a film comprised of the same material as the target and formed on the base material at least on its surface facing the target 1 side.

The openings 6a provided in plurality in the grid plate 6 may preferably have an aspect ratio of less than 1.0, and more preferably less than 0.6. This restrains mutual diffusion of gases and enables formation of films at an appropriate deposition rate and also formation of films with a thickness that is uniform over the whole area.

The openings 6a may have a three-dimensional shape of cylinders, square columns or the like, as viewed from the top of the grid plate. With regard to planar shape, i.e., opening shape (two-dimensional shape), the openings 6a may have any shape of circles, ellipses, squares, triangles, etc.

The aspect ratio AR of the openings 6a is defined as a value (D/L) given by dividing a depth D of each opening (plate thickness) by a diameter L of a true circle having the same area as the area of the opening. Also, when the substrate surface has a circular shape, the diameter L may preferably be from 1% to 15%, and more preferably from 4% to 10%, of the diameter of the substrate 2.

In order to form uniform films, the openings 6a provided in plurality in the grid plate 6 may also preferably be distributed in a regular fashion, and their opening percentage may preferably be from 5% to 90%, and more preferably from 20% to 70%, in order to form uniform and large-area thin films at a suitable deposition rate.

The grid plate 6 is biased at a stated potential so as to produce a potential difference between it and the target, in the state of which the sputtering is carried out. Reference numeral 42 denotes the bias voltage source serving as a potential setting means for setting the potential of the grid plate 6. In the apparatus shown in FIG. 5, the grid plate 6 may preferably be biased to a higher potential than the substrate 2 and biased to a lower potential than the reaction chamber, whereby any impact applied to films when negative ions enter from the plasma to the substrate side can be restrained. In order to enhance the rate of sputtering, the power supplied may be made higher. If, however, it is done, the atoms broken away by sputtering may jump into the substrate so much as to cause an excessive rise of the substrate temperature. If so, the film can not be formed on the substrate that may be easily affected by thermal deformation. In the present embodiment, the grid plate 6 partially captures a part of the atoms broken away by sputtering, and hence such a problem can be solved.

The sputter gas supply port 10 may preferably be provided in plurality as shown in FIG. 5, in the vicinity of the target 1 and also in such a way that the openings surround the target 1. In the apparatus shown in FIG. 5, the sputter gas supply ports 10 are present on the target 1 side with respect to the pipe center and are so made as to preferentially blow out the gas to the target 1 side. The sputter gas supply ports 10 are arranged at substantially equal intervals above the gas shower head 3, a cyclic feed pipe. In other words, it can be said that a plurality of supply ports are provided symmetrically on a circumference.

Similarly, the reactive gas supply port 11 may also preferably be provided in plurality in the vicinity of the substrate 2 and also in such a way that the openings surround the substrate 2. In the apparatus shown in FIG. 5, the reactive gas supply ports 10 are present on the substrate 2 side with respect to the pipe center and are so made as to preferentially blow out the gas to the substrate. The reactive gas supply ports 11 are arranged at substantially equal intervals above the gas shower head 4, a cyclic feed pipe. In other words, it can be said that a plurality of supply ports are provided symmetrically on a circumference.

The substrate holder (substrate holding means) 7 is so constructed as to be rotatable at 1 to 50 rpm during the sputtering. This enables formation of more uniform films. This holder is also kept at a lower potential than the grid plate 6.

A magnet may also be provided at the target holder 12 to carry out reactive magnetron sputtering. When it is so provided, the sputter gas plasma can be confined more in the vicinity of the target.

As the power source 8, an AC power source is used. The AC power source is exemplified by an RF power source of 13.56 MHz, and a DC bias may be optionally superimposed thereon.

The exhaust vent of the reaction chamber 9 is connected to a vacuum pump (not shown). The vacuum pump may be constituted of a turbo-molecular pump or cryopump for evacuation and a rotary pump for rough evacuation in combination.

In FIG. 5, what is illustrated is an apparatus in which the target 1 is provided at the upper part and the substrate 2 at the lower part. This upper-lower relation may be reversed so that the substrate is provided at the upper part with its film-forming side down and the target at the lower part with its sputtering side up. Alternatively, the substrate and target may be raised upward on flat plates so that the film-forming surface and the sputtering surface are not horizontal.

A thin film forming process that forms thin films using the thin film forming apparatus described above will be described below.

First, the target 1, the substrate 2 and the grid plate 6 are placed in the reaction chamber 9 in the manner as shown in FIG. 5. Here, like materials are selected for the target 1 and partition member 6.

The partition member having a plurality of openings is disposed first. Then the target 1 is placed on the target holder 12. Subsequently the substrate 2 is put on the substrate holder 7.

The inside of the reaction chamber 9 is evacuated, and the substrate 2 is heated if necessary.

The sputter gas GA is supplied through the supply ports 10 of the gas shower head 3 into the space formed between the target 1 and the partition member 6, and the reactive gas GB is supplied through the supply ports 11 of the gas shower head 4 into the space formed between the substrate 2 and the partition member 6.

The pressure inside the reaction chamber is maintained approximately at from 0.05 to 13 Pa, and more preferably from 0.1 to 1.3 Pa, in the sate of which a DC voltage or RF voltage is applied across the target 1 and the substrate 2 to generate a discharge to take place between the target 1 and the grid plate 6 to form a plasma 5 of the sputter gas. In this state, the formed plasma 5 may extend into the space between the partition member 6 and the substrate 2 through the openings 6a. Constituent atoms of the target having been sputtered with the plasma particles pass through the openings 6a of the grid plate 6 and reach the surface of the substrate 2. Here, the reactive gas capable of reacting the target constituent atoms is present in the space between the grid plate 6 and the substrate 2, and hence the both react with each other on the substrate surface, so that a film containing the target constituent atoms and the reactive gas constituent atoms can be formed on the substrate.

According to the present embodiment, the grid plate 6 is constituted of the same material as the target 1, and hence the thin film formed on the substrate 2 is not affected even if the plasma particles have sputtered the grid plate 6. Also, the grid plate 6 can prevent the reactive gas from flowing out to the target side, and hence the reaction of the reactive gas with the constituent atoms of the target having been sputtered takes place preferentially on the substrate surface. Thus, the rate of sputtering does not lower, and a thin film having composition fairly approximate to the stoichiometric ratio can be formed at a high deposition rate.

Constituent materials for the target and surface constituent materials for the partition member used in the present invention may include conductive materials such as $SiO_2$, $Al_2O_3$, $Ta_2O_5$, InO, $SnO_2$, TiN, $Cu_2O$, ZnO, $MgF_2$ and WN.

The sputter gas may be selected from He, Ne, Ar, Kr and Xe.

The reactive gas may be selected from $O_2$, $N_2$, $F_2$, $NF_3$ and $O_3$.

As the substrate, any of light-transmitting or non-light-transmitting substrates may be used, and may be made of a material including semiconductor materials such as silicon and GaAs (semiconductor substrates), insulating materials such as glass, quartz and fluorite (insulating substrates), and metallic materials such as stainless steel and aluminum (metal substrates).

Thin films that can be formed according to the present invention are compound thin films of silicon oxide, aluminum oxide, tantalum oxide, indium oxide, tin oxide, magnesium fluoride, titanium nitride, copper oxide, zinc oxide, tungsten nitride and so forth.

The thin film forming apparatus of the present invention is effective especially when optical thin films are formed on the surface of a light-transmitting insulating substrate having a concave surface or convex surface. The optical thin films obtained by the thin film forming process of the present invention exhibits superior characteristics as reflection preventive films or reflection enhancing films for KrF excimer laser and ArF excimer laser optical systems having a high energy.

In instances where films with different composition are formed using the same thin film forming apparatus, the partition member may be set exchangeable.

Figure 7:
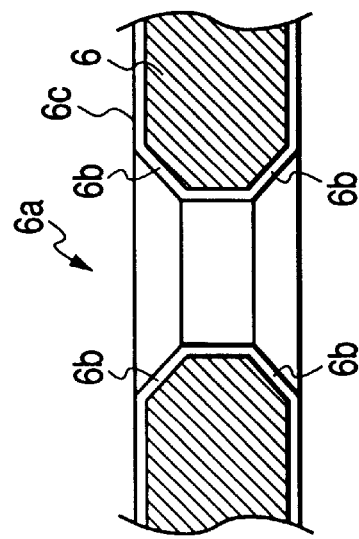
FIG. 7 is a partial cross section of still another partition member used in the present invention.

The atoms broken away by sputtering adhere to the surface of the grid plate. In particular, they may adhere to the corners of openings on the target side to stop up the openings. Accordingly, the corners of openings may preferably be bevelled into a tapered shape so as not to fill up the openings. Then the surface is coated with the same material as the target. FIG. 7 is a partial cross section showing such tapered openings 6a of the grid plate 6. As can be clearly seen when compared with the one shown in FIG. 6, corners 6b are bevelled. This enables the grid plate to be exchanged at less frequencies and makes the apparatus continuously usable for a longer time.

Third Embodiment

Another preferred embodiment of the present invention will be described below.

Figure 8:
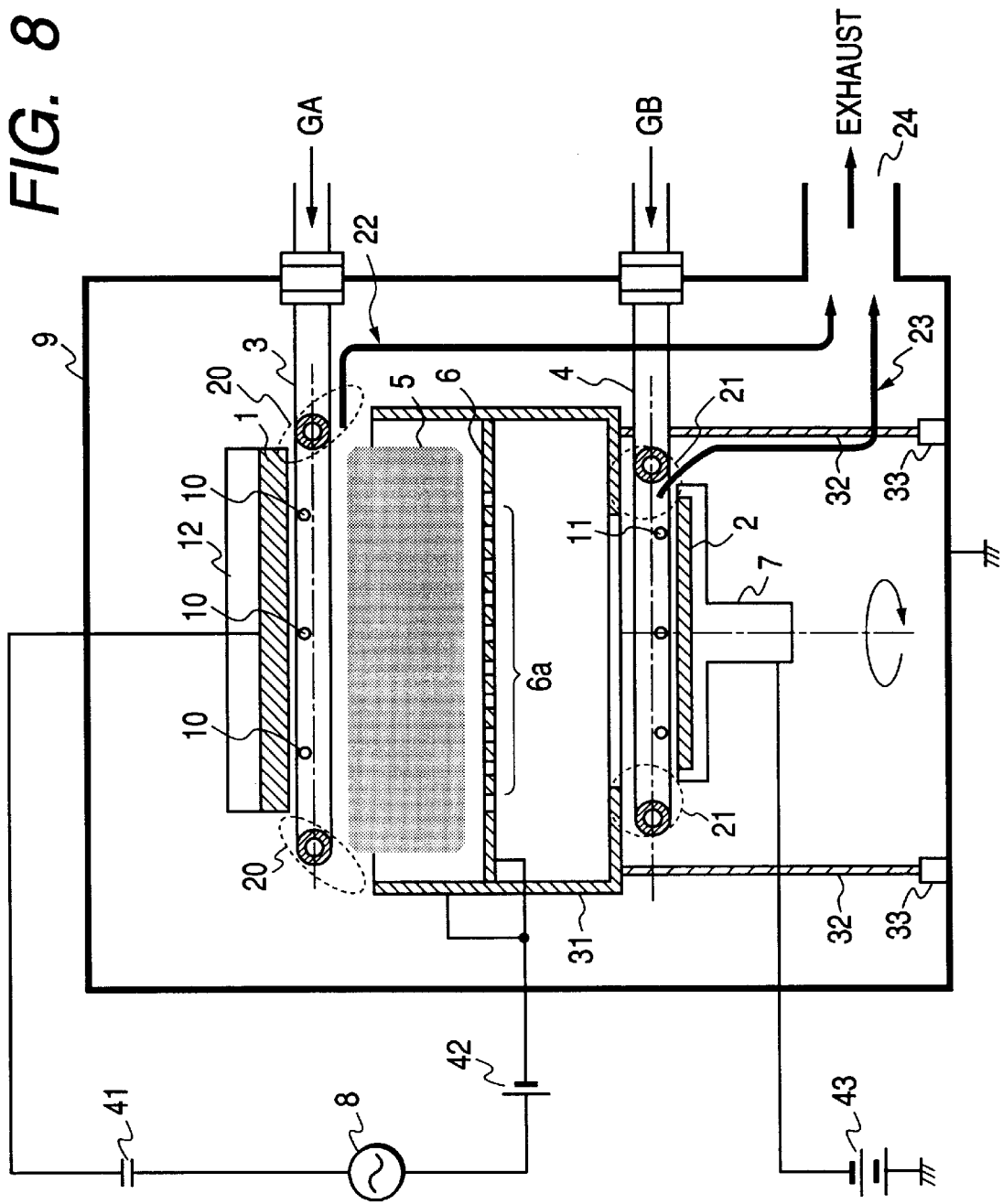
FIG. 8 is a diagrammatic view of a thin film forming apparatus according to still another embodiment of the present invention.

FIG. 8 shows a modification of the above embodiment shown in FIG. 5, where a shielding member 31 of a cylinder shape is provided around the grid plate 6. The shielding member 31 has the function as a deposition preventing plate for preventing the sputtered target constituent atoms from depositing onto the inner walls of the reaction chamber and the function to improve the effect of confining the sputter gas and the effect of confining the reactive gas. In the present embodiment, the gap between the upper edge of the shielding member 31 and the target 1 forms the exhaust part 20, and the gap between the shielding member 31 and the gas shower head 4 and that between the gas shower head 4 and the substrate 2 form the exhaust part 21. The sputter gas GA flows toward the communicating opening 24 through the route as shown by an arrow 22. The reactive gas GB flows toward the communicating opening 24 through the route as shown by an arrow 23. Since the conductance of the routes 22 and 23 is made sufficiently greater than the conductance of the openings 6a of the grid plate 6, the mutual diffusion that may adversely affect the film formation can be restrained.

The shielding member 31 may preferably be formed of the same material as the grid plate 6. Namely, at least the inner surface of the shielding member may preferably be coated with the same materials as that of the target. Further, the potential thereof may also preferably be kept at the same potential state as the grid plate 6 as the partition member. The shielding member 31 is supported by supporting legs 32 set on insulators 33 as insulating members provided on the bottom surface of the reaction chamber. The bias voltage source 42, the substrate bias voltage source 43 and the blocking capacitor 41 are constituted in the same manner as the apparatus of FIG. 5. In FIG. 8, other reference numerals denote like members shown in FIG. 5.

Forth Embodiment

Figure 9:
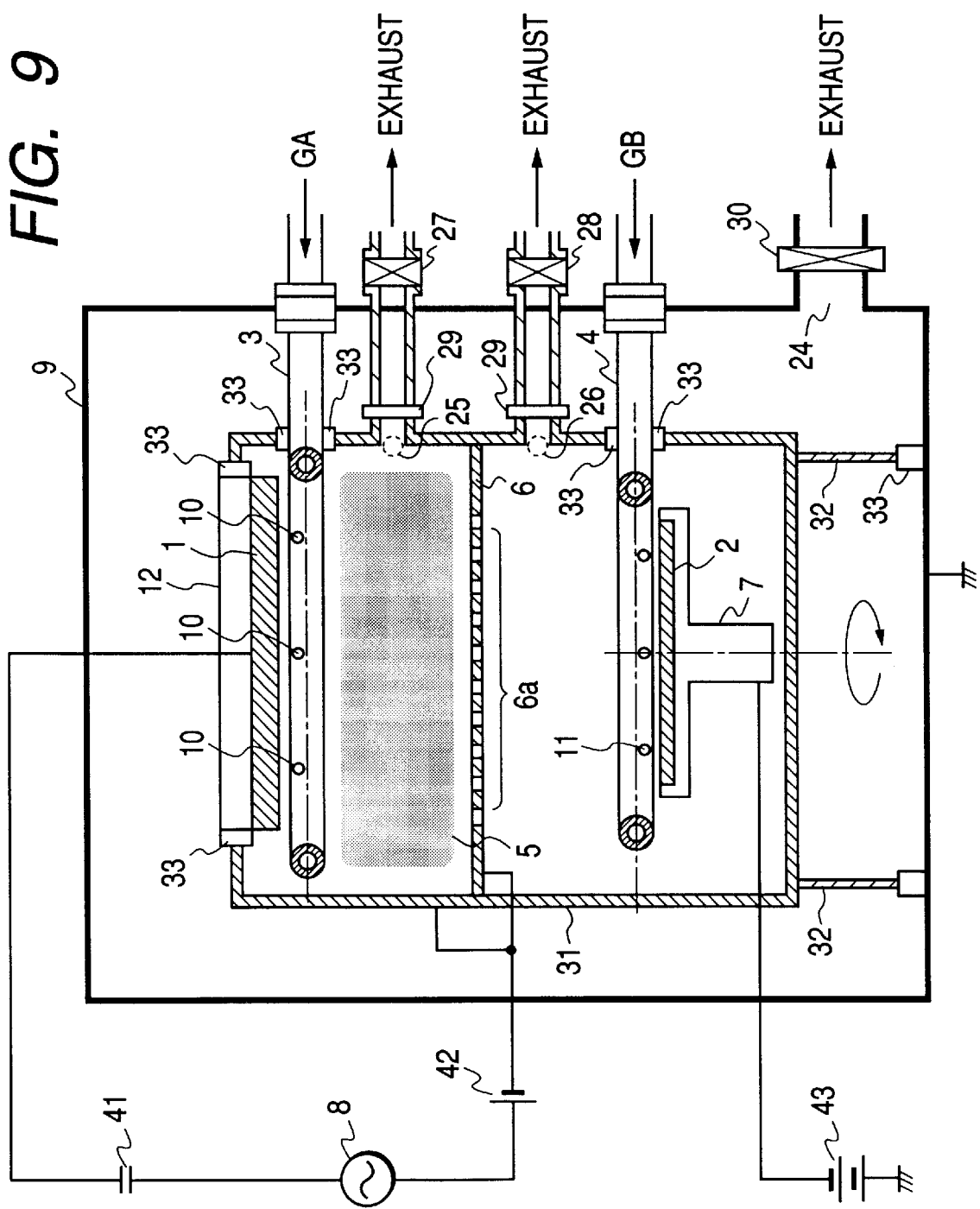
FIG. 9 is a diagrammatic view of a thin film forming apparatus according to a further embodiment of the present invention.
Figure 10:
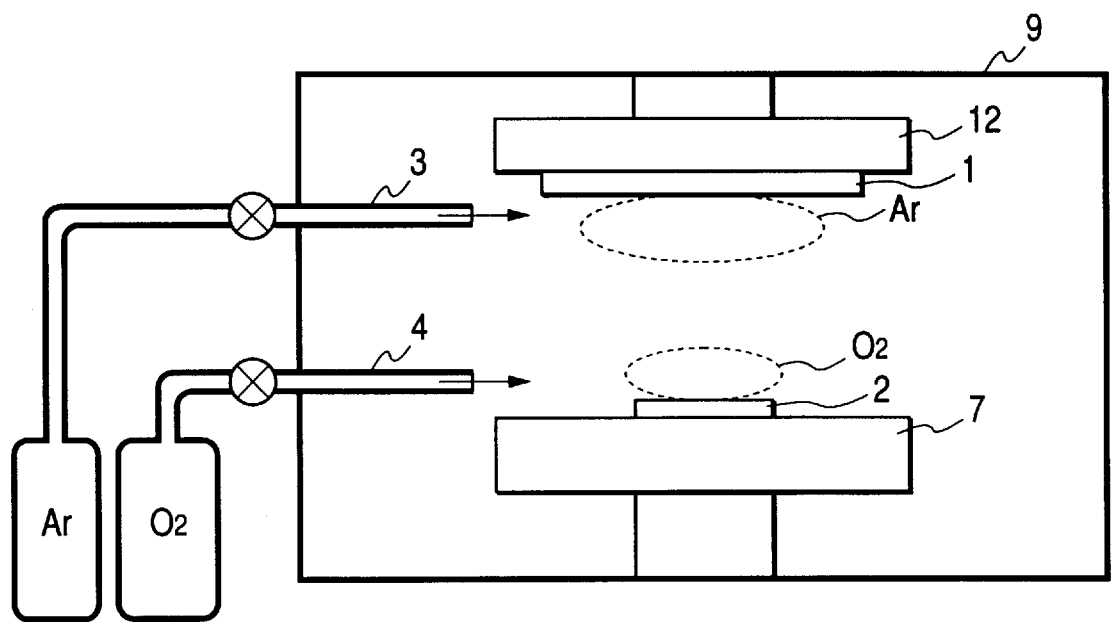
FIG. 10 is a diagrammatic view showing an example of conventional reactive sputtering apparatus.
Figure 11:
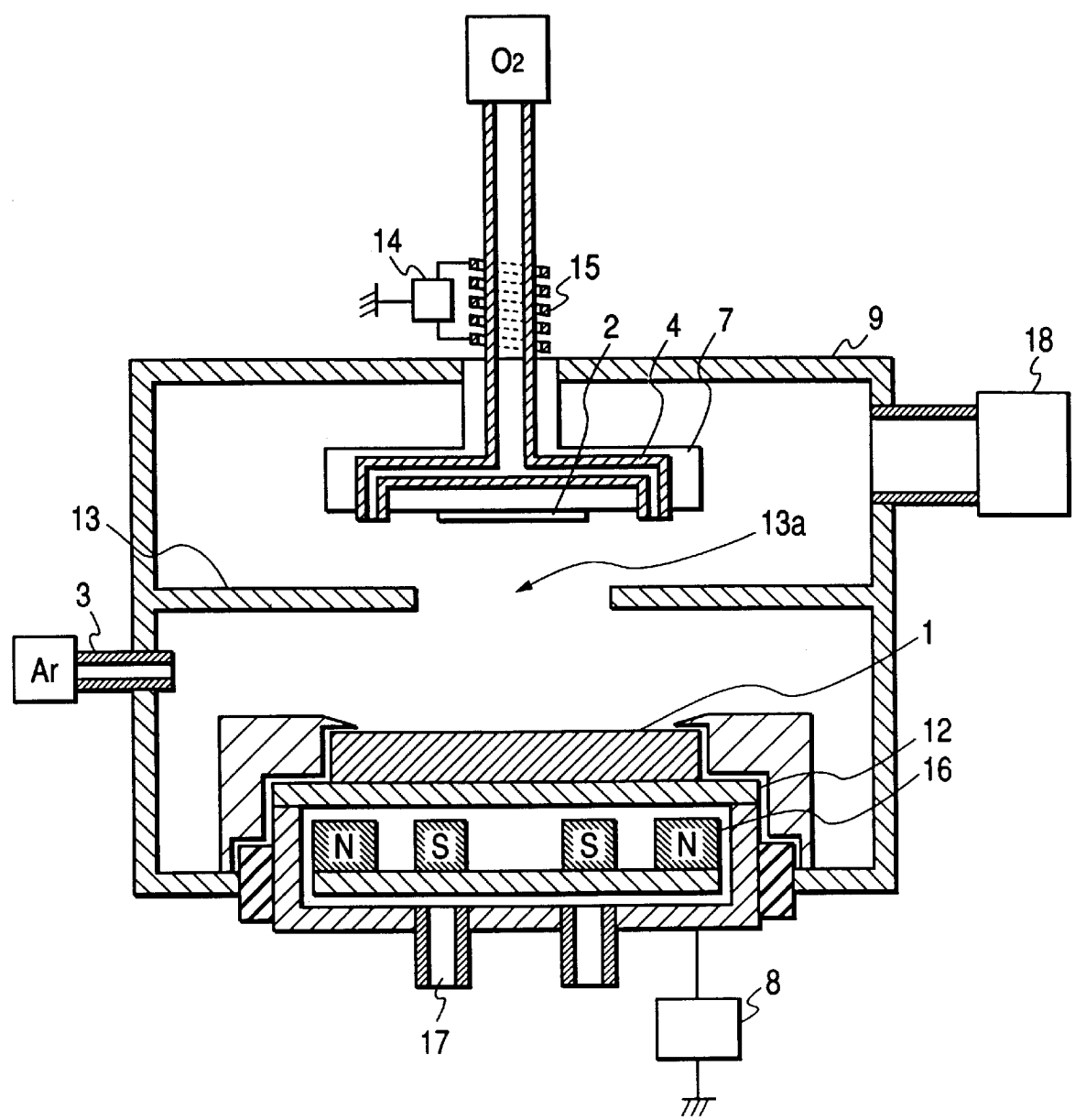
FIG. 11 is a diagrammatic view showing another example of conventional reactive sputtering apparatus.

FIG. 9 is a schematic view illustrating still another embodiment of the present invention. The present embodiment is characterized by being provided with a communicating opening 25 exclusively used for exhausting the sputter gas for exhaust of the space between the grid plate 6 and the target 1 and also with a communicating opening 26 exclusively used for exhausting the reactive gas for exhaust of the space between the grid plate 6 and the substrate 2.

To the shielding member 31 above the grid plate 6 is connected an exhaust pipe to form a communicating opening 25 as an exhaust passage. Reference numeral 27 denotes a valve, by means of which the exhaust route can be opened or closed and its conductance can be adjusted.

To the shielding member 31 below the grid plate 6 is connected another exhaust pipe to form a communicating opening 26 as an exhaust passage. Reference numeral 28 denotes a valve, by means of which the exhaust route can be opened or closed and its conductance can be adjusted.

The two exhaust routes are provided midway with insulators 29 as insulating members so that the reaction chamber is insulated from the shielding member.

Furthermore, the reaction chamber 9 also is provided with a communicating opening 24, as with the apparatus shown in FIG. 8. Exhaust can be effected by opening a valve 30 during film formation.

In the present embodiment, the pressure at which the sputter gas is exhausted from the communicating opening 25 may preferably be made higher than the pressure at which the reactive gas is exhausted from the communicating opening 26 so that the pressure in the plasma-producing space can be higher than the space on the substrate side. This makes it much harder for the reactive gas to flow into the plasma-producing space. Stated specifically, valves 27 and 28 are first closed and the valve 30 is then opened to evacuate the inside of the reaction chamber. Next, the valve 30 is closed and then the valves 27 and 28 are opened to change the exhaust route and to simultaneously introduce the sputter gas and the reactive gas into the reaction chamber through the gas shower heads 3 and 4, respectively. Thus, the sputter gas is introduced into the first space through the supply ports 10, and is exhausted from the first space through the communicating opening 25. The reactive gas is introduced into the second space through the supply ports 11, and is exhausted from the second space through the communicating opening 26. As the switch SW, a switch may be used which is constituted in the same manner as, or constituted to have the function equivalent to, the switch SW shown in FIG. 1. In FIG. 9, other reference numerals denote like members shown in FIG. 8.

According to the present embodiment, compound thin films can be formed which have in-plane uniform thin film thickness and optical or electrical characteristics. Also, uniform and large-area compound thin films can be formed.

What is claimed is:

1. A thin film forming apparatus comprising a substrate holder for holding a substrate, a target holder for holding a target, a sputter gas supply means for supplying into a reaction chamber a sputter gas for sputtering the target, a reactive gas supply means for supplying a reactive gas:

a partition member having a plurality of openings provided between the target and the substrate, and each of the openings has an aspect ratio of less than 0.6; and a sputter gas supply port and a reactive gas supply port separately provided at a distance from each other so that the sputter gas is supplied to a space formed between the target and the partition member and the reactive gas is supplied to a space formed between the substrate and the partition member;

wherein a diameter of each of the openings is 1% to 15% of a diameter of the substrate, such that a pressure in a space on the target side is larger than a pressure in a space on the substrate side.

2. The apparatus according to claim 1, which further comprises a reactive gas evacuation means for evacuating the reactive gas from the space on the substrate side and a sputter gas evacuation means for evacuating the sputter gas from the space on the target side.

3. The apparatus according to claim 1, wherein the sputter gas supply means supplies at least one of Kr and Xe.

4. The apparatus according to claim 1, wherein the diameter of each of the openings is 4% to 10% of the diameter of the substrate.

5. The apparatus according to claim 1, wherein an opening percentage of the partition member is 5% to 90%.

6. The apparatus according to claim 1, wherein an opening percentage of the partition member is 20% to 70%.

7. The apparatus according to claim 1, which further comprises a potential setting means for setting a potential of the partition member.

8. The apparatus according to claim 1, wherein side walls of each of the openings is beveled at their corners both on the target side and the substrate side.

* * * * *